United States Patent
Dimer et al.

(10) Patent No.: US 12,369,428 B2
(45) Date of Patent: Jul. 22, 2025

(54) METHOD OF FORMING TRANSPARENT LAYERS FOR A SOLAR CELL

(71) Applicant: VON ARDENNE Asset GmbH & Co. KG, Dresden (DE)

(72) Inventors: Martin Dimer, Dresden (DE); Uwe Graupner, Dresden (DE)

(73) Assignee: VON ARDENNE Asset GmbH & Co. KG, Dresden (DE)

( * ) Notice: Subject to any disclaimer, the term of this patent is extended or adjusted under 35 U.S.C. 154(b) by 0 days.

(21) Appl. No.: 18/344,898

(22) Filed: Jun. 30, 2023

(65) Prior Publication Data

US 2024/0006545 A1   Jan. 4, 2024

(30) Foreign Application Priority Data

Jun. 30, 2022   (DE) .................. 10 2022 116 340.7

(51) Int. Cl.
*C23C 14/08*   (2006.01)
*C23C 14/06*   (2006.01)
(Continued)

(52) U.S. Cl.
CPC ........... *H10F 77/247* (2025.01); *C23C 14/06* (2013.01); *C23C 14/08* (2013.01); *C23C 14/086* (2013.01); *C23C 14/3464* (2013.01); *C23C 14/352* (2013.01); *H10F 77/211* (2025.01); *H10F 77/311* (2025.01)

(58) Field of Classification Search
CPC ....... H01L 31/022475; H01L 31/02167; H01L 31/022425; H01L 31/022466; H01L 31/1884; H01L 31/022483; C23C 14/06; C23C 14/08; C23C 14/086;
(Continued)

(56) References Cited

U.S. PATENT DOCUMENTS 6,040,521 A * 3/2000 Kushiya .............. H01L 31/1884
257/E31.007
2009/0205707 A1* 8/2009 Ikenoue .............. H01L 31/1852
257/E21.294
(Continued)

FOREIGN PATENT DOCUMENTS

CN   205863192 U   1/2017
CN   208986026 U   6/2019
(Continued)

OTHER PUBLICATIONS

Machine Translation of WO 2014/115770 (Year: 2014).*
(Continued)

*Primary Examiner* — Rodney G McDonald
(74) *Attorney, Agent, or Firm* — VIERING, JENTSCHURA & PARTNER mbB

(57) ABSTRACT

Disclosed herein are devices, systems, and methods for processing a solar cell precursor. The processing may include forming a transparent, electrically conductive first layer over the solar cell precursor. The processing may also include forming a transparent, electrically conductive second layer over the solar cell precursor, preferably in physical contact with the first layer. The first layer may comprise at least indium, zinc, and oxygen and the second layer may comprise oxygen and a greater proportion of indium than the first layer.

17 Claims, 7 Drawing Sheets

(51) Int. Cl.
 *C23C 14/34* (2006.01)
 *C23C 14/35* (2006.01)
 *H10F 77/20* (2025.01)
 *H10F 77/30* (2025.01)

(58) Field of Classification Search
 CPC . C23C 14/3464; C23C 14/352; H10F 77/247; H10F 77/211; H10F 77/311
 USPC ........................................ 204/298.24, 192.29
 See application file for complete search history.

(56) References Cited

U.S. PATENT DOCUMENTS

| | | | |
|---|---|---|---|
| 2011/0100442 A1* | 5/2011 | Huang | H01L 31/065 136/255 |
| 2011/0226320 A1 | 9/2011 | Little et al. | |
| 2011/0297217 A1 | 12/2011 | Barkhouse et al. | |
| 2012/0009730 A1 | 1/2012 | Voser et al. | |
| 2012/0060916 A1* | 3/2012 | den Boer | H01L 31/022466 136/256 |
| 2014/0261660 A1 | 9/2014 | Hu et al. | |
| 2016/0056409 A1 | 2/2016 | Nabatame et al. | |

FOREIGN PATENT DOCUMENTS

| | | |
|---|---|---|
| CN | 111653644 A | 9/2020 |
| CN | 114242809 A | 3/2022 |
| JP | H05346586 A | 12/1993 |
| JP | 2010080358 A | 4/2010 |
| WO | WO 20144115770 * | 7/2014 |

OTHER PUBLICATIONS

Search Report issued for the corresponding German patent application No. 10 2022 116 340.7, dated Nov. 23, 2022, 9 pages (for informational purposes only).

European Search Report issued for the corresponding European patent application No. 23180279.4, dated Dec. 4, 2023, 7 pages (for informational purposes only).

* cited by examiner

METHOD OF FORMING TRANSPARENT LAYERS FOR A SOLAR CELL

CROSS-REFERENCE TO RELATED APPLICATION(S)

This application claims priority to German Patent Application No. 10 2022 116 340.7 filed on Jun. 30, 2022, the contents of which are incorporated fully herein by reference.

TECHNICAL FIELD

The disclosure relates generally to solar cells, and in particular, to transparent layers (e.g., on a solar cell precursor) and methods for forming transparent layers.

BACKGROUND

Since the development and commercialization of the solar cell for energy generation, attention has often been placed on the efficiency of the solar cell as being the central optimization parameter. However, other parameters also play a very relevant role for the market, including manufacturing costs and/or durability. Various architectures have been developed to optimize the cost/benefit ratio. One of these architectures uses what is known as a transparent conductive oxide (TCO) layer to absorb the generated current of the solar cell. In this architecture, the TCO layer is deposited on a selective contact layer of doped amorphous silicon (a-Si). A metallic grid is often printed on the TCO layer to collect the charge carriers. The doped amorphous silicon layers have too high of a resistance to dissipate the charge carriers generated in the silicon to the metallic grid. The much higher conductivity of the TCO layer enables charge carrier transport to the metallic grid. This architecture is often used, for example, in so-called heterojunction silicon technology (also referred to as silicon heterojunctions, HJS, SHJ, etc.), in which crystalline silicon, in the form of a silicon wafer, is sandwiched between at least two layers of amorphous silicon.

Traditionally, these TCO layers are based on indium oxide, for example tin-doped indium oxide (ITO). In general, the aim is for the properties of the TCO layer to encompass the highest possible transparency and the highest possible electrical conductivity. However, these properties are effectively opposites, so there is usually a trade-off between them. In addition, the properties of the TCO layer are adapted to the underlying doped a-Si layer and the layer over (e.g., on top of) it, which is usually metallic, for example so that they have the lowest possible contact resistance to one another, resulting in a low series resistance of the solar cell. Matching these properties promotes high solar cell efficiency. One challenge is how to deposit TCO layers that exhibit very high transparency, low resistance, and also low contact resistance. Unfortunately, indium—and thus a TCO layer based on it—are very expensive. In addition, indium is a rare element and only available in limited quantities.

BRIEF DESCRIPTION OF THE DRAWINGS

In the following description, various exemplary aspects of the disclosure are described with reference to the following drawings, in which.

DESCRIPTION

Figure 1:
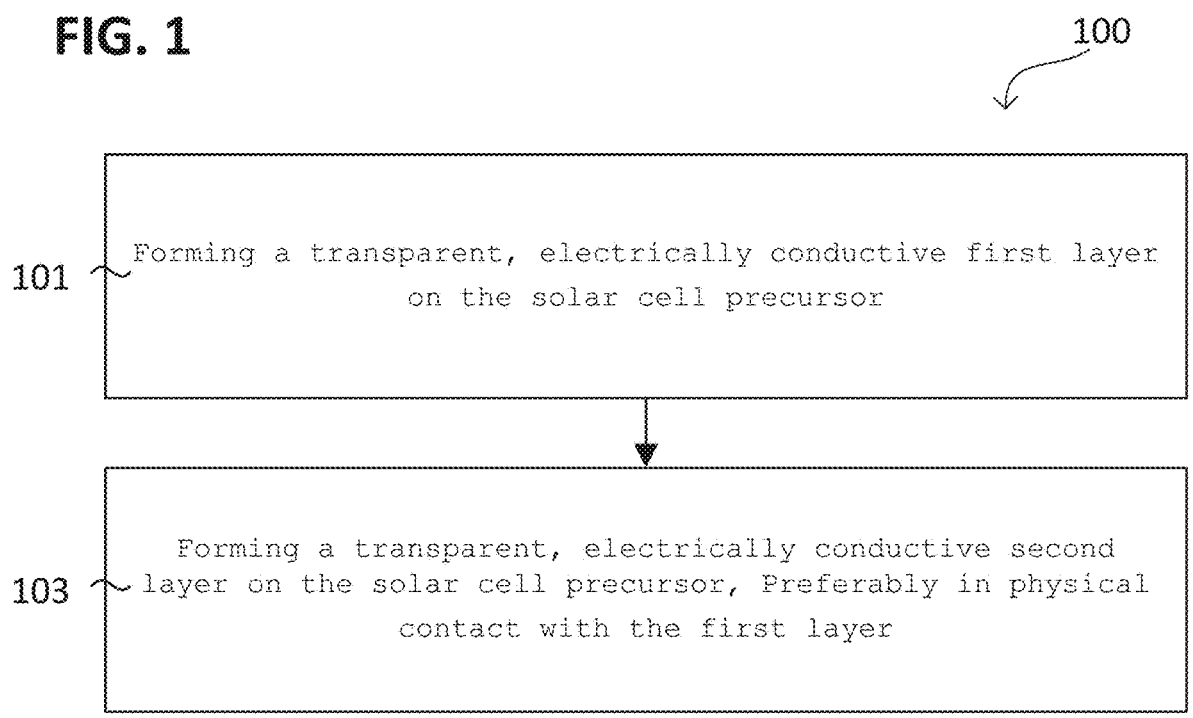
FIG. 1 shows a method according to various embodiments in a schematic flow diagram.

The following detailed description refers to the accompanying drawings that show, by way of illustration, exemplary details and features.

The word "exemplary" is used herein to mean "serving as an example, instance, or illustration." Any aspect or design described herein as "exemplary" is not necessarily to be construed as preferred or advantageous over other aspects or designs.

Throughout the drawings, it should be noted that like reference numbers are used to depict the same or similar elements, features, and structures, unless otherwise noted.

In the following detailed description, reference is made to the accompanying drawings which form part thereof and in which are shown, for illustrative purposes, specific embodiments in which the invention may be practiced. In this regard, directional terminology such as "top", "bottom", "front", "rear", "forward", "rearward", etc. is used with reference to the orientation of the figure(s) described. Since components of embodiments may be positioned in a number of different orientations, the directional terminology is for illustrative purposes and is not limiting in any way. It is understood that other embodiments may be used and structural or logical changes may be made without departing from the scope of protection of the present invention. It is understood that the features of the various exemplary embodiments described herein may be combined, unless otherwise specifically indicated. Therefore, the following detailed description is not to be construed in a limiting sense, and the scope of protection of the present invention is defined by the appended claims.

In the context of this description, the terms "connected", "attached" as well as "coupled" are used to describe both a direct and an indirect connection (e.g. ohmic and/or electrically conductive, e.g. an electrically conductive connection), a direct or indirect connection as well as a direct or indirect coupling. In the figures, identical or similar elements are given identical reference signs where appropriate.

As noted above, it has been challenging to deposit TCO layers that exhibit very high transparency, low resistance, and also low contact resistance, especially where indium—and thus a TCO layer based on it—is very expensive and where indium is a rare element that is available in only limited quantities.

As discussed in more detail below, the disclosed method of forming layers may offer cheaper and more readily available ways to provide a TCO layer for a solar cell.

According to various embodiments, aluminum-doped zinc oxide (AZO) may offer a cheaper and more readily available option for providing a TCO layer for a solar cell. In particular, the established view that AZO is unsuitable because of its higher resistivity and its tendency to age rapidly, thereby significantly degrading efficiency, has been overcome. The rapid aging of AZO may be monitored, for example, using the so-called steam-heat test, in which the solar cell is exposed to elevated temperature and humidity. The aging is expressed, for example, in a significant increase in the resistivity.

With this context in mind, solar cell efficiency was improved by using a layer stack in which a layer of AZO is thinly covered with ITO, as part of, for example, a layer stack of ITO/AZO/ITO. Covering a layer of AZO with a thin layer of ITO, therefore, leads to a solar cell efficiency that is comparable to that of ITO alone. In particular, the AZO layer may degrade less or not at all in the steam-heat test when the AZO layer is covered with an ITO layer (e.g., as a top layer).

In this context, according to various embodiments, the cost pressure under which the production of solar cells is subject may be considered. These production costs increase in proportion to the number of process chambers and also the length of the process chambers. This limits the possibilities for increasing the number of different layers of a TCO layer stack. The same applies to existing sputtering systems, where it may be difficult to integrate the production of additional layers, since these are deposited, for example, with different process parameters that those for which the sputtering systems may have been originally designed.

According to various embodiments, a TCO layer stack based on AZO is disclosed below, where, for example, it may be used as a front contact and/or back contact of a solar cell and which may be less expensive to implement, for example without the need to install additional process or gas separation chambers.

Reference is made herein to various oxides, for example indium tin oxide (also referred to as ITO) and aluminum doped zinc oxide (also referred to as AZO), which are configured as transparent electrically conductive oxides (also referred to as TCO). What is described herein may also apply to a transparent electrically conductive oxide (also referred to as TCO), for example fluorine-tin oxide (FTO) and/or antimony-tin oxide (ATO).

The following describes various examples relating to what is described herein and what is shown in the figures.

Example 1 is a method of processing (e.g., coating and/or by means of a continuous process, e.g., in-line coating) a solar cell precursor (also referred to herein as pre-solar cell, a pre-stage solar cell, solar cell stack, or solar cell substrate) (e.g. for depositing one or more than one layer on the solar cell precursor), the method including: forming a transparent, electrically conductive first layer on the solar cell precursor (e.g., in physical contact with the solar cell precursor); forming one or more than one transparent, electrically conductive second layer on the solar cell precursor (e.g., between the substrate and the first layer and/or in physical contact with the first layer and/or the solar cell precursor); wherein the first layer includes oxygen and indium (e.g. a chemical compound of indium with oxygen and preferably a first dopant of the chemical compound of indium with oxygen), and wherein the first layer further includes zinc and/or aluminum (e.g. a chemical compound of oxygen with zinc and preferably a second dopant, e.g. the aluminum, of the chemical compound of oxygen with zinc); wherein the or each second layer includes oxygen and has a greater proportion (e.g. a greater concentration) of one or more of indium, aluminum and/or zinc (e.g., more indium than zinc) and/or smaller gradients of proportion than the first layer.

Example 2 is a method (e.g., according to example 1) for processing a solar cell precursor, the method including: emitting a first material flow including zinc and oxygen toward the solar cell precursor; emitting a second material flow including indium and oxygen toward the solar cell precursor; wherein the emitting of the first material flow and the emitting of the second material flow is done such that thereby a (e.g., homogeneous) material mixture (simplified as a mixture) is formed with which the solar cell precursor is coated. (e.g. homogeneous) material mixture (simplified also referred to as mixture) with which the solar cell precursor is coated, which is transparent and electrically conductive and which includes a proportion of indium which (e.g. continuously) increases or decreases along a direction (e.g. the direction of the layer thickness) away from the solar cell precursor and/or along a path away from the substrate that extends more than 5 nm (e.g., more than 10 nM, e.g., more than 15 nm), wherein the material mixture includes e.g. at least indium, zinc and oxygen and/or provides a first layer.

Example 3 is a solar cell (preferably manufactured by the method of example 1 or 2), including: a semiconductor (e.g. as a substrate), preferably providing a semiconductor junction; a transparent, electrically conductive first layer over (e.g., on top of) the semiconductor (e.g. in physical contact with the semiconductor); one or more than one transparent, electrically conductive second layer over (e.g., on top of) the semiconductor (e.g. in physical contact with the semiconductor and/or the first layer); wherein the first layer includes oxygen and indium (e.g. a chemical compound of indium with oxygen and preferably a first dopant of the chemical compound of indium with oxygen), and wherein the first layer includes zinc and/or aluminum (e.g., a chemical compound of oxygen with zinc and preferably a second dopant, e.g. aluminum, of the chemical compound of oxygen with zinc); the or each second layer including oxygen and including a greater proportion of one or more of indium, aluminum and/or zinc and/or smaller gradients of the proportion than the first layer.

Example 4 is any of examples 1 to 3, wherein a first material flow for forming the first layer and a second material flow for forming the second layer interpenetrate and/or are exposed to the same process gas (e.g., the same chemical composition thereof and/or the same pressure thereof). This optimizes the coating properties.

Example 5 is any of examples 1 to 4, wherein the second layer includes a chemical compound of oxygen with indium or zinc and preferably the first dopant, e.g. tin, of the chemical compound of oxygen with indium. This may optimize the coating properties.

Example 6 is any of examples 1 to 5, wherein a first rate (e.g., specified as amount of material per time) at which forming of the first layer occurs is greater than a second rate (e.g., specified as amount of material per time) at which forming of the second layer occurs. This may optimize the cost-benefit ratio.

Example 7 is any of examples 1 to 6, wherein the first layer is disposed between the solar cell precursor and the second layer, or wherein the second layer is disposed between the solar cell precursor and the first layer.

Example 8 is any of examples 1 to 7, wherein the first layer and/or the second layer are in physical contact with a semiconductor of the solar cell precursor and/or an oxide of the semiconductor. This may optimize the electrical coating properties.

Example 9 is any of examples 1 to 8, wherein the second layer includes a chemical compound of oxygen with one or more than one of indium, aluminum and/or zinc. This may optimize the coating properties, e.g. with regard to electrical conductivity.

Example 10 is any of examples 1 to 9, wherein the first layer includes a homogeneous mixture of indium and zinc or their chemical compounds with oxygen (i.e. their oxide). This may optimize the coating properties, e.g. in terms of electrical conductivity.

Example 11 is any of examples 1 to 10, wherein the second layer is free of zinc. This may optimizes the coating properties, e.g. with regard to optical properties.

Example 12 is any of examples 1 to 11, wherein the second layer includes a greater specific conductivity than the first layer. This may optimize the coating properties, e.g. with regard to electrical conductivity.

Example 13 is any of examples 1 to 12, wherein the second layer includes a larger transmission coefficient than the first layer. This may optimize the coating properties, e.g. in terms of efficiency.

Example 14 is any of examples 1 to 13, wherein a coating (e.g., a layer stack) of the solar cell precursor including the first layer and the second layer, preferably at a wavelength of 600 nm, has a reflection coefficient of less than 1%. This may optimize the coating properties, e.g. with respect to efficiency, and/or allows for adjustment by way of the oxygen flow.

Example 15 is any of examples 1 to 14, wherein the first layer and/or the second layer include a first dopant of a chemical compound of indium with oxygen, the first dopant preferably including tin and/or zirconium and/or titanium and/or cerium, and/or tungsten, or consisting thereof (e.g. a combination of two or more of these different chemical elements). This may optimize the coating properties, e.g. in terms of electrical properties.

Example 16 is any of examples 1 to 15, wherein the second layer includes more indium than zinc and/or more indium than aluminum (e.g., twice as much indium as zinc and/or at least 10 nm thick). This may optimize the coating properties, e.g. with regard to service life.

Example 17 is any of examples 1 to 16, wherein forming of the first layer is performed by means of sputtering of a first, preferably ceramic, sputtering target and/or wherein forming of the second layer is performed by means of sputtering of a second, preferably ceramic, sputtering target. This may optimize the coating properties, e.g. with regard to manufacturing costs.

Example 18 is any of examples 1 to 17, wherein the first layer includes a greater layer thickness (extent along a direction away from the solar cell precursor) than the second layer, for example, wherein the first layer includes a layer thickness of at least twice the layer thickness of the second layer and/or greater than about 50 nanometers (e.g., about 80 nanometers). This may optimize the coating properties, e.g., in terms of cost/benefit ratio.

Example 19 is any of examples 1 to 18, wherein the first layer is arranged between the second layer and the solar cell precursor and/or wherein the second layer includes a higher proportion of indium than the first layer. This may optimize the coating properties, e.g. with respect to lifetime.

Example 20 is any of examples 1 to 19, wherein the solar cell precursor is covered with a transparent, electrically conductive additional second layer on a side on which the first layer and/or second layer are formed (preferably wherein the first layer is disposed between the second layer and the additional second layer and/or preferably wherein the additional second layer is disposed between the first layer and the solar cell precursor); wherein the additional second layer includes a greater proportion of indium or zinc than the first layer and/or has a smaller thickness than the first layer; wherein, for example, the additional second layer physically contacts the second layer or the first layer. This may optimize the coating properties, e.g., in terms of adhesion and/or degradation of the solar cell precursor.

Example 21 is any of examples 1 to 20, wherein the second layer includes a smaller proportion of tin and/or aluminum than the first layer and/or than the additional second layer. This may optimize the coating properties, e.g. with regard to electrical properties.

Example 22 is any of examples 1 to 21, wherein the solar cell precursor or solar cell includes a semiconductor junction.

Example 23 is any of examples 1 to 22, wherein the semiconductor junction includes a plurality of layers including silicon and/or differing in their degree of crystallinity (degree of structural order in a solid, e.g. indicated as the proportion of crystals), and/or including a layer of crystalline silicon between two layers of amorphous silicon. This may optimize the manufacturing costs.

Example 24 is any of examples 1 to 23, wherein the solar cell further includes a metallization that contacts (e.g., electrically and/or physically) the second layer and/or a coating (e.g., a layer stack) of the solar cell precursor which includes the first layer and the second layer. This may optimize the coating properties, e.g. with respect to electrical contacting.

Example 25 is example 24, wherein the metallization includes a plurality of ohmically coupled strips and/or is disposed in a trench formed in the second layer. This may improve the electrical properties.

Example 26 is any of examples 1 to 25, wherein the first layer includes a proportion of zinc that continuously decreases over an extent of the first layer (e.g., toward or away from the solar cell precursor), the extent being greater than 15 nm.

Example 27 is any of examples 1 to 26, wherein forming the first layer over (e.g., on top of) the solar cell precursor occurs when (e.g., while) the solar cell precursor is being transported and/or wherein forming the second layer over (e.g., on top of) the solar cell precursor occurs when (e.g., while) the solar cell precursor is being transported.

Example 28 is any of examples 1 to 27, wherein of the one or more second layers, at least one second layer TCO2 is disposed between the substrate and the first layer TCO1 and/or the at least one second layer TCO2 includes more indium than zinc (and/or than tin) (e.g., proportionately, e.g., expressed in atomic percent or mass percent), and/or the at least one second layer TCO2 consists essentially (e.g., 50% thereof or more, e.g., 75% or more, e.g., 90% or more, e.g., 95% or more, e.g., 100%) of ITO.

Example 29 is any of examples 1 to 28, wherein the first layer TCO1 includes zinc and/or aluminum, preferably in a greater ratio to indium than the second layer TCO2.

Example 30 is any of examples 1 to 29, wherein the one or more than one second layer TCO2 includes at least two second layers TCO2 between which the first layer TCO1 is disposed, wherein the first layer has a greater thickness than the or each second layer of the two layers, for example as an additional second layer of the two second layers, for example wherein the first layer is disposed between the second layer and the additional second layer.

Example 31 is any of examples 1 to 30, wherein of the one or more than one second layer TCO2, the or each second layer (e.g., each of two second layers) includes more indium than zinc or than tin (e.g., proportionally, e.g., expressed in atomic percent or mass percent) (e.g., includes more than twice as much indium as zinc), and/or wherein of the one or more than one second layer TCO2, the or each second layer (e.g., each of two second layers) includes at least 10 nm.

Example 32 is any of examples 1 to 31, wherein a first rate (e.g., specified as amount of material per time) at which formation of the first layer (e.g., including or consisting of AZO) occurs is greater than a second rate (e.g., specified as amount of material per time) at which formation of the second layer (e.g., including or consisting of ITO) occurs, e.g., greater than twice the second rates. This may optimize the cost to benefit ratio.

Example 33 is any of examples 1 to 32, wherein the or each second layer has a thickness greater than 5 nm (e.g., 10 nm or 15 nm) or less than a thickness of the first layer and/or wherein the second layer has a gradient of indium that decreases away from the substrate and/or is extended beyond the thickness of greater than 5 nm (e.g., 10 nm or 15 nm).

Reference is made herein to various indicia of the proportion of a chemical element or material to a reference, the reference including the chemical element or material. The proportion may be or be indicated as proportion of the total mass (then also referred to as proportion by weight, e.g. specified as wt %) of a reference;

proportion of the total volume (then also referred to as proportion by volume, e.g. specified as vol %) of the reference;

proportion of the substance quantity of the reference (then also referred to as substance quantity proportion, e.g. given as at %); or concentration (e.g. given as number of atoms per volume, e.g. in $at/cm^3$).

For example, the body (e.g., the sputtering target or a layer) including the chemical element or material, or a homogeneous mixture of materials including the chemical element or material may serve as a reference.

With regard to the layer-forming process, reference is made herein to so-called sputtering as an example. The term "sputtering" refers to the atomization of a material (also referred to as coating material or target material) by means of a plasma. The atomized components of the coating material (e.g. individual atoms and/or ions) are separated from each other, thereby forming a material flow, and may be deposited elsewhere, for example, to form a layer. The sputtering may be performed by means of a so-called sputtering device, which may include one or more than one magnet system (then also referred to as magnetron). The coating material may be provided by means of a so-called sputtering target (also referred to as target for short), which may be, for example, tubular (then also referred to as tubular target) or plate-shaped (then also referred to as plate target or planar target). To generate the plasma, a voltage (also referred to as sputtering voltage) may be applied to the sputtering target (also referred to as target for short) so that the sputtering target is operated as a cathode. Even if the sputtering voltage includes an AC voltage, the term cathode is often retained.

For sputtering, the sputtering target may be located in a vacuum processing chamber (also shortened to processing chamber or vacuum chamber) so that sputtering may be performed in a vacuum. To this end, the environmental conditions (the process parameters) within the vacuum processing chamber (e.g., process pressure, temperature, gas composition, etc.) may be adjusted or controlled during sputtering. For example, a working gas may be or may be provided within the processing chamber, denoting the plasma-forming gas or the plasma-forming gas mixture. For example, the processing chamber may be or may be configured to be air-tight, dust-tight, and/or vacuum-tight, such that a gas atmosphere having a predefined composition (also referred to as a working atmosphere) or pressure (also referred to as a working pressure or process pressure) may be provided within the processing chamber (e.g., according to a set point), such as a vacuum.

The plasma may be formed by means of the working gas (also referred to as plasma-forming gas). According to various embodiments, the working gas may include a gaseous material that is inert, in other words that participates in few or no chemical reactions. For example, a working gas may be or become defined by and adapted to the target material used. For example, a working gas may include a gas or gas mixture that does not react with the target material to form a solid or is even inert to it. For example, the working gas may include a noble gas (e.g., helium, neon, argon, krypton, xenon, radon) or a plurality of noble gases. If a reactive gas is used as the process gas or a component thereof, the reactive gas may include a higher chemical reactivity than the working gas, e.g., with respect to the target material. In other words, the atomized target material may react faster (i.e., form more reaction product per time) together with the reactive gas (if present) than together with the working gas (e.g., if it reacts chemically with the working gas at all). The reactive gas and the working gas may be supplied together or separately as a process gas (e.g. as a gas mixture), for example by means of the gas supply device.

It may be understood that what is described herein for sputtering may apply by analogy to any other coating process, e.g., a physical vapor deposition, in which the target material is present as a solid material at room temperature. For example, physical vapor deposition (e.g., sputtering) includes transferring the chemical composition of the target or coating material into the layer being formed. When a reactive gas is used, a layer including the reaction product of the target material and reactive gas may be formed.

In contrast to CVD (Chemical Vapor Deposition), in PVD (Physical Vapor Deposition), e.g. sputtering, a solid material is first transitioned into the gas phase (also referred to as gaseous phase or vapor) and a layer is formed by means of this gas phase. The gaseous phase of the target material may optionally (e.g., in a reactive PVD) be chemically reacted (for example, then also referred to as reactive PVD or reactive sputtering) with a reactive gas to form a chemical compound that is incorporated into or forms the layer. Thus, in the chemical reaction of PVD, two or more materials are combined to form the chemical compound.

Sputtering is used, for example, to form a semi-crystalline to amorphous silicon thin film, which is then post-treated by means of a subsequent high-temperature step for doping and/or crystallization (so-called "solid phase crystallization").

A semiconductor junction (also known as a p-n junction) is an interface where two semiconductors with opposite doping touch each other. At the semiconductor junction, for example, the doping changes from positive (p) to negative (n).

Herein, reference is made to a method and a vacuum arrangement (e.g., vacuum system thereof) configured, for example, to perform the method, in connection with processing a pre-solar cell (also referred to as a solar cell precursor or a partially processed solar cell) as an exemplary substrate. The solar cell precursor may include or consist of a pre-processed wafer. Alternatively or additionally, the solar cell precursor may include a solar cell layer stack (e.g., including a semiconductor junction). It may be understood that what is described for the solar cell precursor may apply to any other substrate including a semiconductor and/or coated with one or more than one (e.g. amorphous) semiconductor, preferably including silicon. With respect to the coating and/or with respect to the processing, it may further be understood that what is described for a specific side (e.g. rear side or front side) of the solar cell precursor (or substrate) may apply by analogy to the respective opposite side (then front side or rear side) of the solar cell precursor (or substrate).

FIG. 1 illustrates a method 100 according to various embodiments, for example, according to any of examples 1 to 25, in a schematic flowchart.

Forming 101 the transparent, electrically conductive first layer (also referred to as the first TCO layer) on the solar cell precursor and/or forming 103 the or each transparent, electrically conductive second layer (also referred to as the second TCO layer) on the solar cell precursor may preferably be performed in a vacuum.

For example, the first TCO layer may include indium oxide (IO) as a chemical compound of indium and oxygen, wherein the indium oxide is preferably doped with tin as a first dopant (then also referred to as ITO). It may be understood that alternatively or in addition to tin, cerium and/or tungsten may also be used as the first dopant. This leads to other electrical and optical properties, which may be advantageous for solar cell properties.

For example, the first TCO layer may include zinc oxide (ZnO) as a chemical compound of zinc and oxygen, wherein the zinc oxide is preferably doped with aluminum as a second dopant (then also referred to as AZO).

For example, the first TCO layer may include a (e.g., homogeneous) mixture of indium oxide (e.g., ITO) and zinc oxide (e.g., AZO) and/or a gradient (i.e., a gradual change) in the proportion of indium or of zinc, the gradient being directed, for example, toward or away from the second TCO layer.

According to various embodiments, the first TCO layer is provided as a so-called mixed layer including or formed from a (e.g. homogeneous) mixture of ITO and AZO.

In a first exemplary implementation of the first TCO layer, its content of indium (also referred to as In content) may be in an extent ranging from about 5 to about 95% and/or have a gradient in an extent ranging from about 1 at %/nm to at least 30 at %/nm, e.g., about 4 at %/nm. The gradient may, for example, be directed toward or away from the second TCO layer and/or extend over a region ranging from about 1 nm to at least 15 nm in the first TCO layer.

In the first or a second exemplary implementation of the first TCO layer, the zinc (also referred to as Zn) proportion thereof may be in a region ranging from about 5 to about 95% and/or have a gradient in a region ranging from about 1 at %/nm to at least 30 at %/nm, e.g., about 4 at %/nm. For example, the gradient may be directed toward or away from the second TCO layer and/or extend over a region ranging from about 1 nm to at least 15 nm in the first TCO layer.

In the first, second, or an additional second exemplary implementation of the first TCO layer, its aluminum content (also referred to as Al content) may be in a range from about 0 to about 2% and/or have a gradient in a range from about 1 at %/nm to at least 30 at %/nm, e.g., about 4 at %/nm. Alternatively or additionally, a ratio of aluminum to zinc in the first TCO layer may be configured to be the same on opposite sides of the first TCO layer. For example, the gradient may be directed toward or away from the second TCO layer and/or extend over a range of about 1 nm to at least 15 nm in the first TCO layer.

In the first, second, additional second, or a fourth exemplary implementation of the first TCO layer, the tin (also referred to as Sn) proportion thereof may be in a range from about 0 at % to about 10 at % and/or have a gradient in a range from about 1 at %/nm to at least 30 at %/nm, e.g., about 4 at %/nm. Alternatively or additionally, a ratio of tin to indium in the first TCO layer may be configured to be the same on opposite sides of the first TCO layer. For example, the gradient may be directed toward or away from the second TCO layer and/or extend over a range of about 1 nm to at least 15 nm in the first TCO layer.

In a first configuration (see FIG. 7A), for example, when the first TCO layer is configured as a mediator layer and/or a second TCO layer is configured as a protective layer, the first TCO layer may be disposed between the second TCO layer and the solar cell precursor.

In a second configuration (see FIG. 7B), for example, when the first TCO layer is configured as a protective layer and/or when a second TCO layer is configured as a mediator layer, the second TCO layer may be disposed between the first TCO layer and the solar cell precursor.

In an exemplary implementation of method 100, an in-line deposition of an ITO-AZO layer stack is performed in a vacuum (e.g., in a process chamber) using a double-tube magnetron or two tube magnetrons arranged side-by-side. To form the layer stack, at least two TCO layers (also referred to as first and second TCO layers) are deposited sequentially. The first of the two TCO layers includes indium, zinc, tin, aluminum, and oxygen. The second of the two TCO layers includes indium, tin, and oxygen, or includes zinc, aluminum, and oxygen.

For example, the first TCO layer may be or be provided as a mixed layer of ITO and AZO. Alternatively or additionally, the second TCO layer may consist of either ITO or AZO.

According to various embodiments, an in-line coating method 100 is thus provided for depositing a transparent and electrically conductive layer stack (also referred to as a TCO layer stack) including at least two adjacent (e.g., touching) layers TCO1 and TCO2. The first layer consists of at least elements A, B and O. A and B stand for two different metals or semimetals, such as In and Zn. O stands for oxygen. The layer TCO2 consists of at least the elements B and oxygen.

According to various embodiments, an in-line coating method 100 is thus provided for depositing a transparent and electrically conductive layer stack, wherein the layer stack is formed by means of sputtering of at least two ceramic sputtering targets (also referred to as targets for short), the two targets having a different chemical composition from each other, being arranged adjacent to each other and being installed in the same process chamber, the steam lobes of which overlap such that two adjacent layers TCO1 and TCO2 are formed. Preferably, the thickness of layer TCO1 is greater when depositing the layer from two adjacent targets than from two targets that are further spatially separated from each other and located in two different process chambers.

Optionally, the TCO layer stack including the two adjacent (e.g., touching) layers TCO1 and TCO2 may be configured as an anti-reflection layer. Then, preferably at a wavelength in a range from about 500 nm to about 700 nm, the TCO layer stack may have a reflection coefficient of less than about 10% (e.g., than about 5% or than about 1%). This is achieved by adjusting the refractive index and the layer thickness of the TCO layer stack.

Figure 6A:
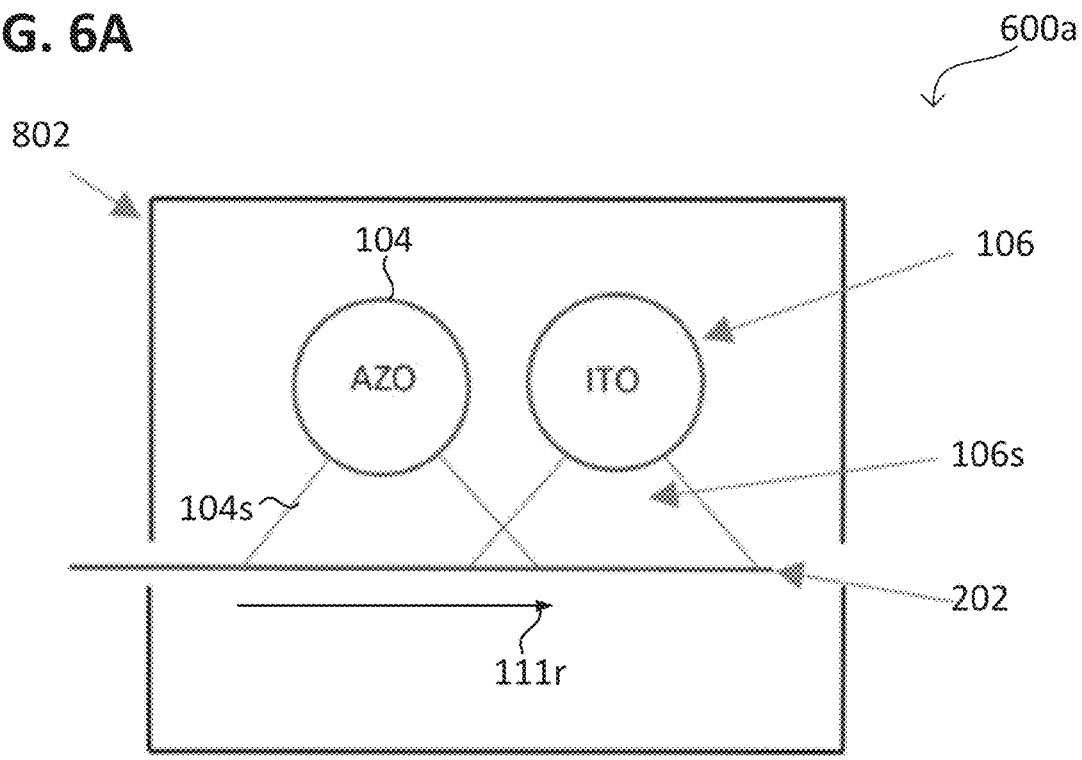
FIGS. 6A and 6B each depict a vacuum arrangement according to various embodiments.
Figure 6B:
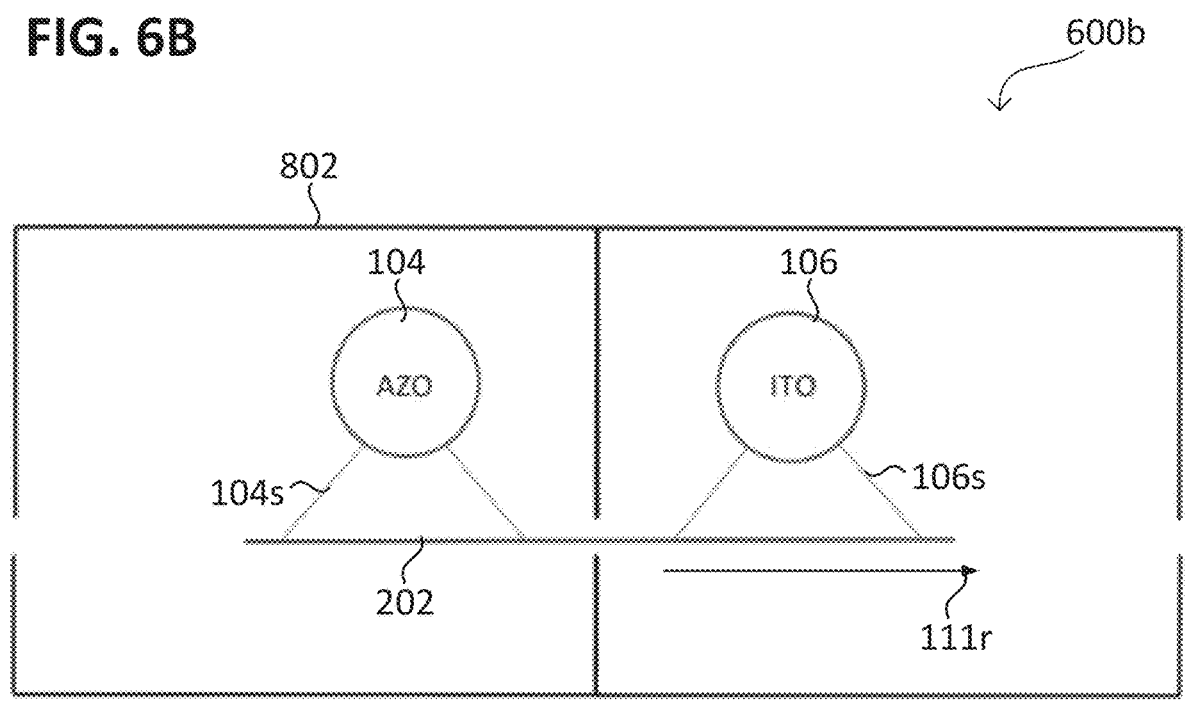

The solar cell precursor may be transported while forming the first TCO layer and/or the second TCO layer, for example along a transport direction 111*r* (see FIG. 2) and/or in a vacuum provided, for example, in a vacuum chamber 802 (see FIGS. 6A and 6B).

Figure 2:
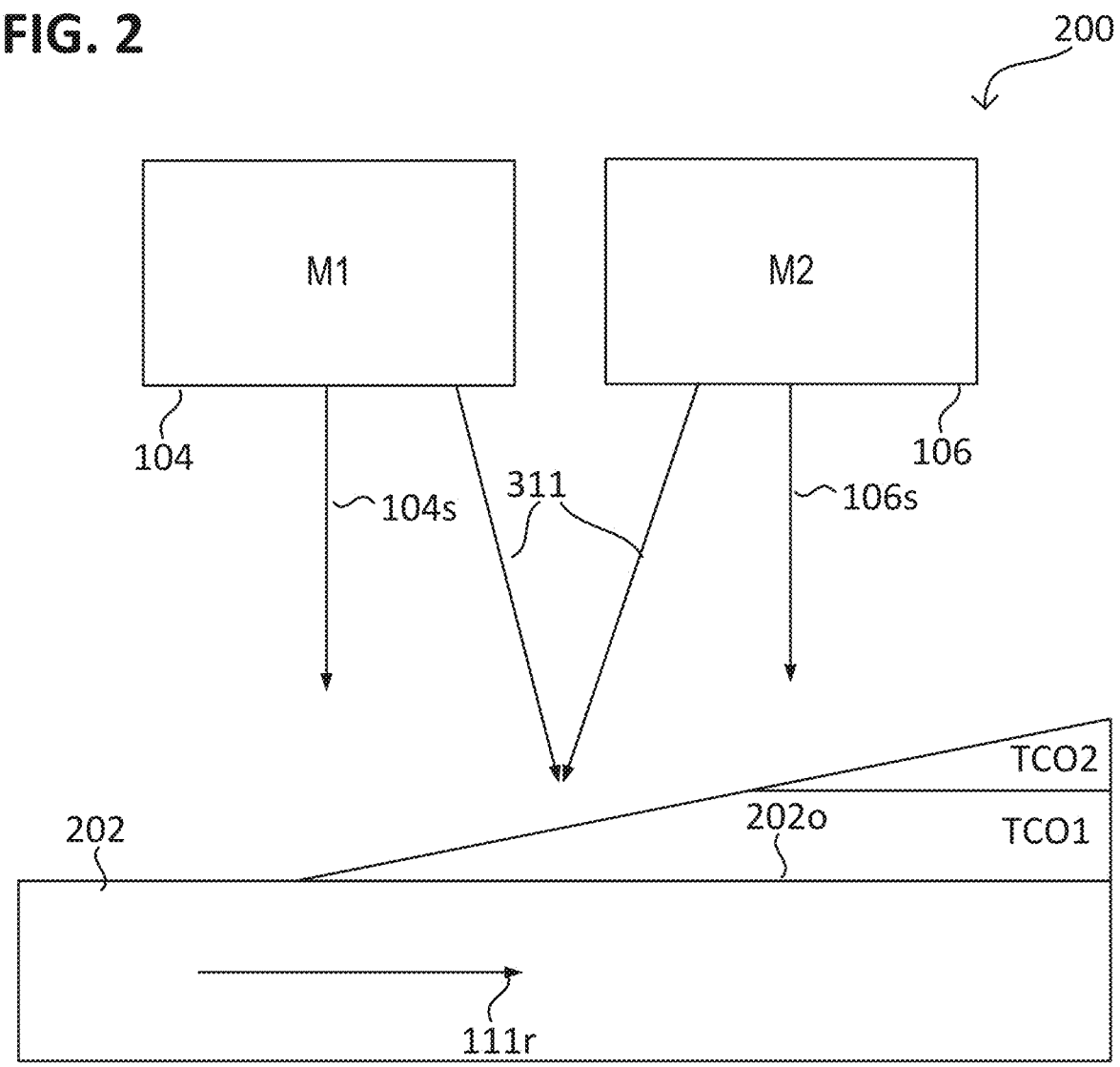
FIGS. 2, 3 and 4 each illustrate a schematic view of a method according to various embodiments.

FIG. 2 illustrates the method 100 according to various embodiments 200, for example according to any of examples 1 to 25, in a schematic side view or cross-sectional view, which are configured to implement the first configuration, for example.

The solar cell precursor 202 may include a side 202*o* (also referred to as the side to be coated) that is coated with the first TCO layer TCO1. The side to be coated may be, for example, a front side or a back side of the solar cell precursor 202. A semiconductor of the solar cell precursor or an oxide of the semiconductor may be exposed on the side 202*o* to be coated.

Forming the first TCO layer TCO1 may be performed by means of a first material source 104 configured to emit a first material flow 104*s* to the solar cell precursor 202. The first material source 104 may include or consist of a first target material M1, for example in the form of a first sputtering target (e.g. AZO sputtering target). The first sputtering target may be atomized using a plasma to emit the first material flow 104*s*. The first target material M1 may include or consist of zinc oxide, for example, AZO.

Forming the second TCO layer TCO2 may be performed by means of a second material source 106 configured to emit a second material flow 106*s* to the solar cell precursor 202. The second material source 106 may include or consist of a second target material M2, for example, in the form of a second sputtering target (e.g., ITO sputtering target). The second sputtering target may be atomized using a plasma to emit the second material flow 104*s*. For example, the second target material M2 may include or consist of indium oxide (IO), such as ITO.

Portions of the second material flow 106*s* may contribute to forming the first TCO layer TCO1. To this end, the first material flow 104*s* and the second material flow 106*s* may interpenetrate. Illustratively, the interpenetration results in a homogeneous mixture of indium, zinc, and oxygen, e.g., a homogeneous mixture of indium oxide and zinc oxide, e.g., a homogeneous mixture of ITO and AZO. The mixing improves the coating properties.

This interpenetration is promoted by arranging the first target material M1 and the second target material M2 close to each other. For example, a distance (also referred to as a TT distance) of the first target material M1 from the second target material M2 may be smaller than a distance of the solar cell precursor 202 from the first target material M1 and/or the second target material M2. Alternatively or additionally, a distance of the first target material M1 from the second target material M2 may be smaller than about 0.5 meters, e.g., than about 0.3 meters, e.g., than about 0.2 meters, e.g., than about 0.1 meters, e.g., than about 0.05 meters. This promotes mixing of the materials. In the case of tubular magnetrons, which are the preferred coating sources, the TT distance may be the distance between the target surfaces of the two adjacent tubular targets.

The first TCO layer TCO1 may include a larger proportion of the first target material M1 near the solar cell precursor 202 than near the second TCO layer TCO2, i.e., its proportion of the first target material M1 increases in the direction towards the solar cell precursor 202. Alternatively or additionally, the first TCO layer TCO1 including a smaller proportion of the second target material M2 near the solar cell precursor 202 than near the second TCO layer TCO2 or being free of the second target material M2.

In an exemplary implementation of embodiments 200, a second TCO layer TCO2 may be formed from ITO over (e.g., on top of) the first TCO layer TCO1 including a ratio of ITO to AZO increasing toward the second TCO layer TCO2. This slows down the aging process of the first TCO layer TCO1 at low cost.

Figure 3:
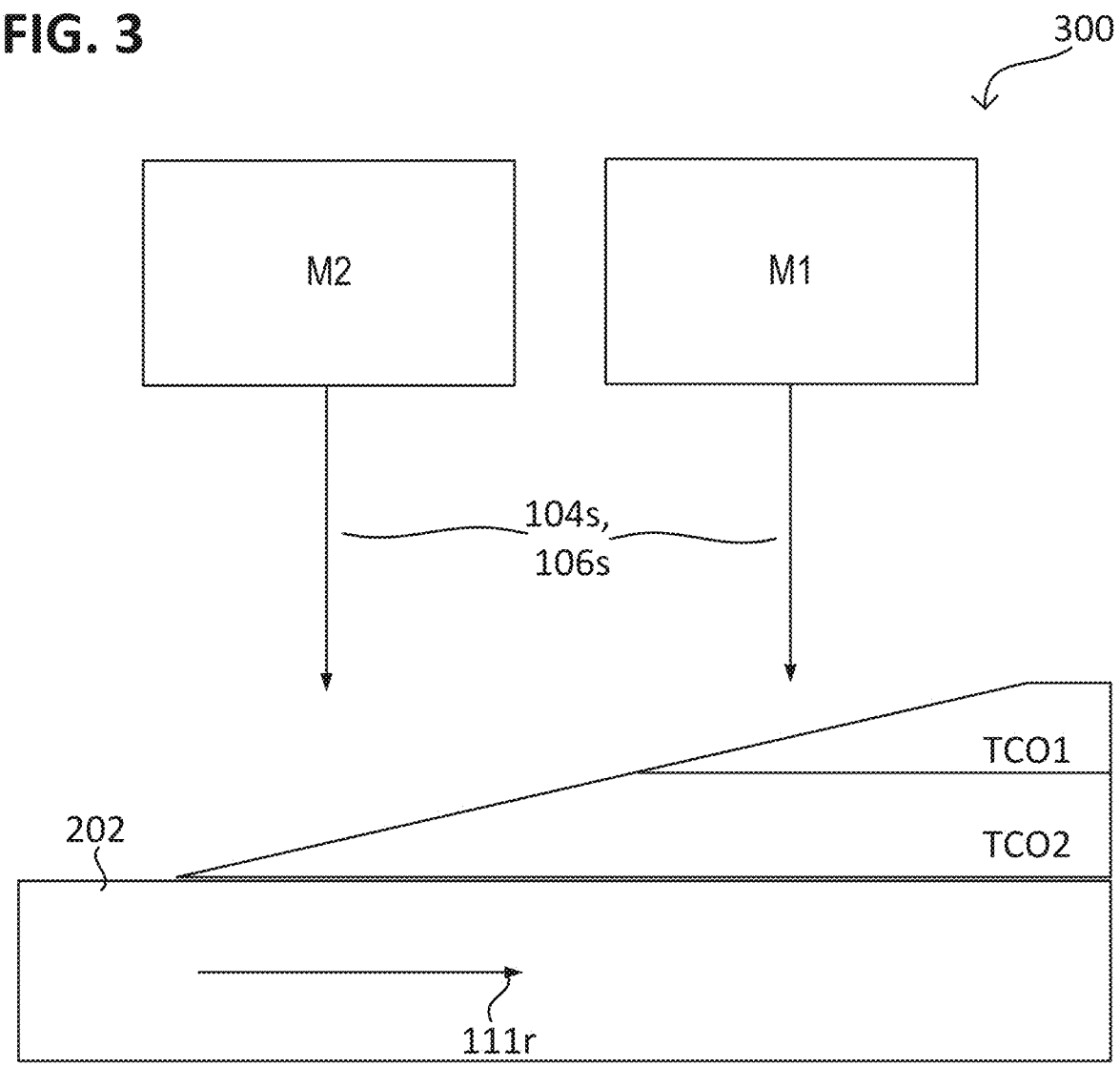

FIG. 3 illustrates the method 100 according to various embodiments 300, for example according to any of examples 1 to 25, in a schematic side view or cross-sectional view. According to the embodiments 300, for example as an alternative or in addition to the embodiments 200, coating may be performed by means of the first target material M1 before coating is performed by means of the second target material M2.

Portions 311 of the two material flows 104*s*, 106*s* may contribute to forming the first TCO layer TCO1. For this purpose, the two material flows may interpenetrate each other. This facilitates the process.

The first TCO layer TCO1 may include a larger proportion of the first target material M2 near the solar cell precursor 202 than is near the second TCO layer TCO2. Alternatively or additionally, the first TCO layer TCO1 may include a smaller proportion of the second target material M2 near the solar cell precursor 202 than is near the second TCO layer TCO2.

In an exemplary implementation of embodiments 300, an AZO layer may be formed as a second TCO layer TCO2 under the first TCO layer TCO1. This further reduces the cost of the process.

Figure 4:
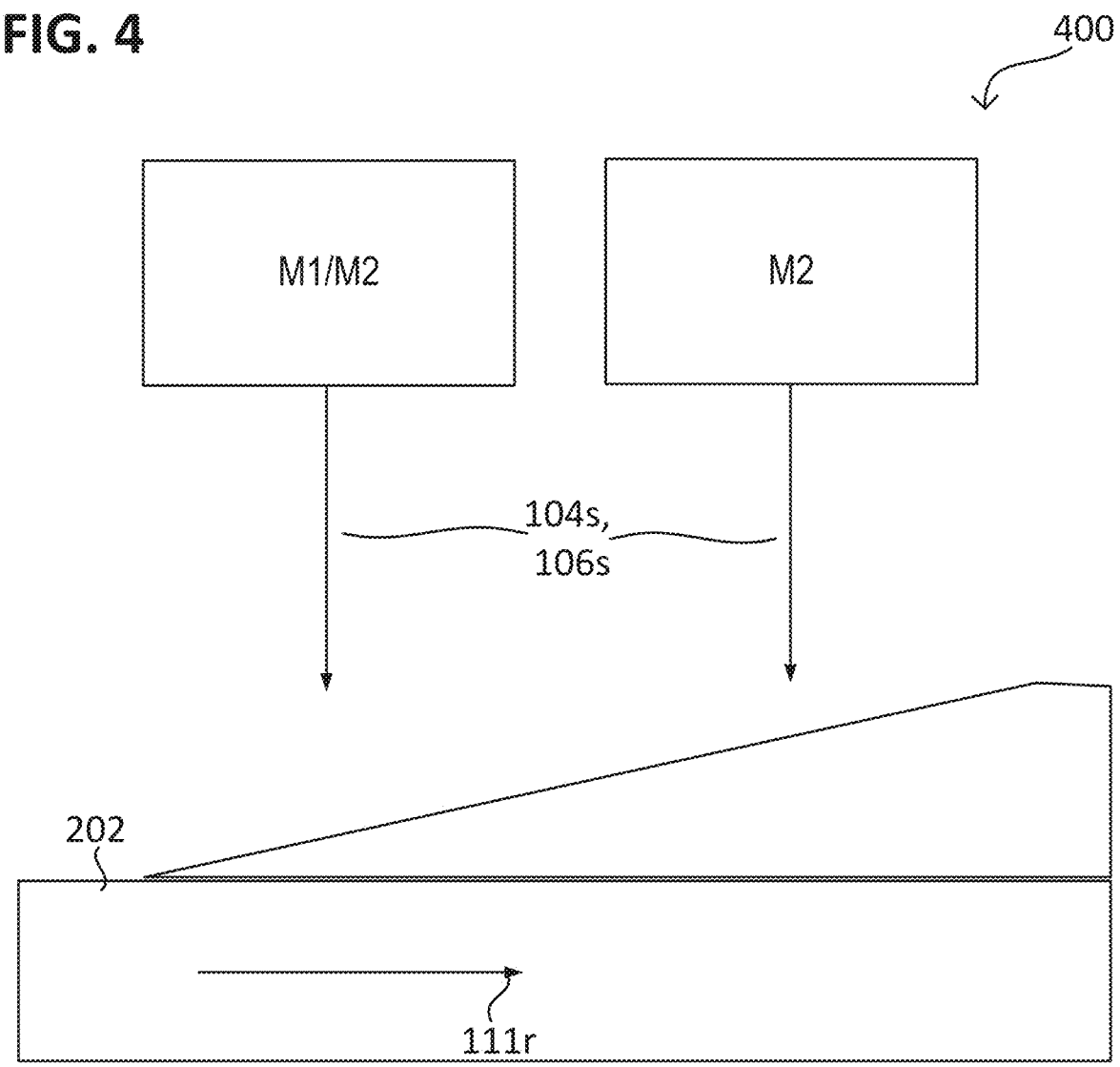

FIG. 4 illustrates the method 100 according to various embodiments 400, for example according to any of examples 1 to 25, in a schematic side view or cross-sectional view, which are configured to implement the second configuration, for example.

Embodiments 400 may include covering the solar cell precursor 202 with a plurality of second TCO layers (TCO2), for example in physical contact with each other or sandwiching the first TCO layer (TCO1). The forming of each second TCO layer may be performed, for example, using the first target material M1 or the second target material M2. In the course of coating, intermixing of the first target material M2 and the first target material M2 may occur at at least one location, such that the solar cell precursor 202 is coated with a mixture of materials that is transparent and electrically conductive and includes a proportion of indium that continuously increases or decreases along a direction away from the solar cell precursor.

In an exemplary implementation of embodiments 400, an ITO layer may be formed as a second TCO layer over (e.g., on top of) the first TCO layer TCO1. This slows down the aging process of the solar cell coated with only the first TCO layer TCO1.

Figure 5A:
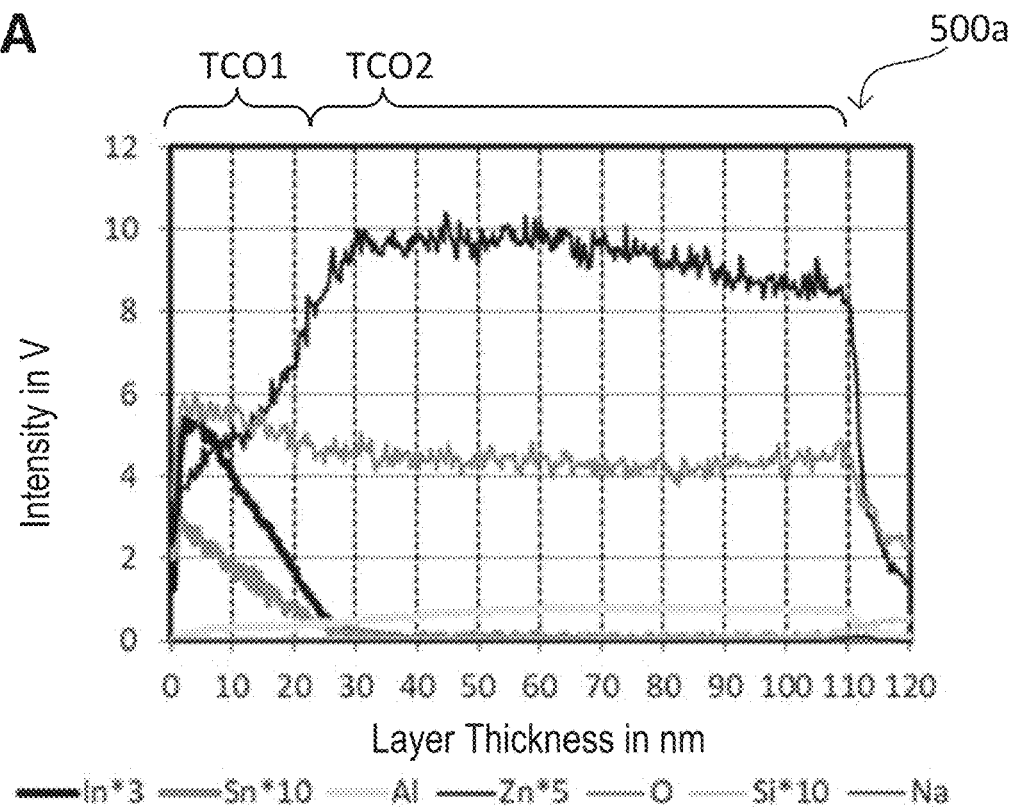
FIGS. 5A and 5B each depict a diagram according to different embodiments.
Figure 5B:
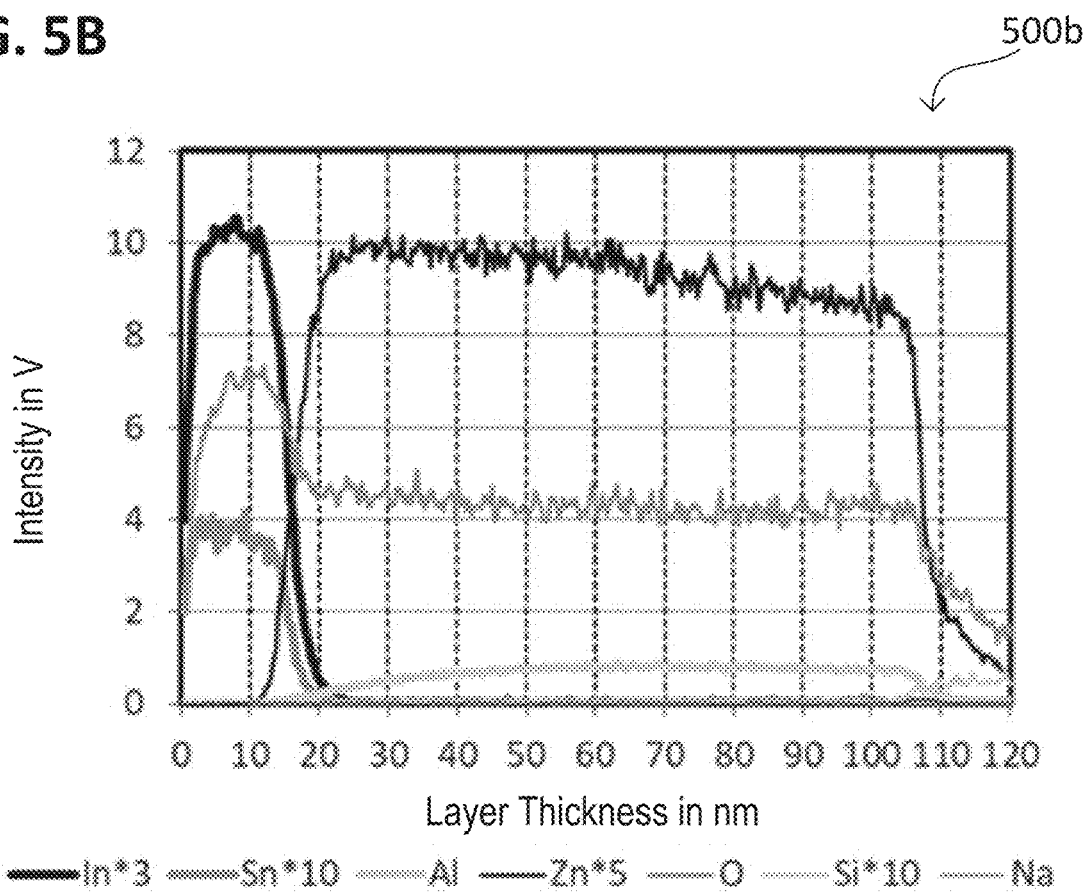

FIGS. 5A and 5B respectively illustrate a diagram 500*a* and 500*b*, according to various embodiments, for example according to any of examples 1 to 25, in a schematic view. Illustrated is the spatial distribution of the chemical composition of two exemplary layer stacks for comparison, each formed using two sputtering targets, for example configured to be tubular cathodes, one sputtering target of which was ITO (also referred to as ITO sputtering target) and the other sputtering target of which was AZO (also referred to as AZO sputtering target).

Diagram 500*a* shows as a first case that the two sputtering targets are arranged close to each other in such a way that the two material flows of ITO and AZO penetrate each other. Diagram 500*b* shows as a second case that the two sputtering targets are arranged far from each other in such a way that the two material flows of ITO and AZO are separated (e.g. gas separated) from each other. For example, in the second case, the two sputtering targets may be arranged in processing chambers that are gas separated from each other.

The optical emission of the chemical elements of the coating stack was measured by means of glow discharge optical spectroscopy (GD-OES). In glow discharge spectroscopy, the coating to be investigated (e.g. the layer stack) is ablated by means of ion bombardment of a glow discharge. The ablated elements of the coating are excited by the glow discharge and emit an element-specific, characteristic radiation, which is measured with time resolution. Time is a measure of the location of the measurement as it moves into the coating over time, which in this case is a measure of the location along the thickness of the coating. The intensity of the characteristic radiation of an element is a measure of the amount of the element in the coating stack. The higher the intensity of the element, the higher its proportion (e.g. concentration) in the layer stack.

In each of the diagrams 500*a* and 500*b*, the optical intensity is plotted for each of the elements indium, tin, aluminum, zinc, oxygen, silicon, and sodium, as a function of location along the thickness of the coating including the first TCO layer and the second TCO layer.

The coating of diagram 500*b* was formed by depositing approximately 85 nm (nanometers) of AZO onto a glass substrate in a first processing chamber. Immediately thereafter, approximately 20 nm of ITO was deposited on the AZO in a second process chamber that was gas separated from the first process chamber. The two material flows (illustratively referred to as vapor lobes) of the AZO and ITO sputtering processes do not exhibit interpenetration (overlap) due to deposition in process chambers that are gas separated from each other. Nevertheless, between 12 and 22 nm, diagram 500*b* shows an increase in zinc intensity and a decrease in indium intensity and thus their concentrations.

This overlapping of indium and zinc in a range of the layer thickness, in the exemplary case here between 12 and 22 nm, is indeed an indication that a mixed layer may have been formed, including indium, zinc and oxygen. However, it is important to note the spatial resolution limit of the measurement method, which ablates a surface with the diameter of approximately 4 mm. Furthermore, the layer stack is not ablated perfectly homogeneously by the glow discharge. Depressions, so-called sputter trenches, are created, which may lead to the fact that, despite a sharp interface between two layers, intensities of the elements of both the one and the other layer may be measured at the same time. The same applies to the roughness of the interface.

This compares well with the interface between glass and AZO in the range between 102 and 120 nm in diagram 500*b*. There, the optical emission of both silicon and zinc is measured, although a sharp interface exists between glass and the AZO layer.

If the intensity curve is adjusted for these influences, there is an abrupt, very steep drop in the indium intensity and an abrupt, very steep rise in the zinc intensity at 20 nm, which results from the spatial separation of the AZO and ITO sputtering processes from each other. The reason for the non-abrupt increase or decrease in the intensities of zinc and indium is thus due to the measurement process.

The stack of layers in diagram 500*a* was formed by sputtering from the two sputtering targets (e.g., tubular cathodes) in close proximity to each other in the same process chamber, for example, from a double-tube magnetron. This proximity of the tube cathodes promotes that their vapor lobes overlap, i.e., interpenetrate each other and mix in the process. For example, a distance between the target surfaces of the two sputtering targets may be smaller than a distance between the solar cell precursor 202 and the target surfaces. Alternatively or additionally, a distance of the two target surfaces of the sputtering targets from each other may be smaller than about 0.5 meters, e.g., than about 0.3 meters, e.g., than about 0.2 meters, e.g., than about 0.1 meters, e.g., than about 0.05 meters. This promotes the mixing of the materials.

The coating rate of the AZO sputter target had been determined experimentally and separately on glass for an AZO layer thickness of 20 nm and for that of the ITO sputter target for an ITO layer thickness of 90 nm and thus adjusted. Diagram 500*a* shows the presence of both indium and zinc between 0 and 25 nm. The range in which intensities of zinc and indium are measured simultaneously is 25 nm, which is significantly larger than the range of about 10 nm shown in diagram 500*b*.

These data indicate that interpenetration of the material flows promotes forming a mixture with which the solar cell precursor is coated, the mixture including indium, zinc, and oxygen, and preferably further including a first dopant of the chemical compound of indium and oxygen and/or a second dopant of the chemical compound of zinc and oxygen.

The mixing of the material flows (e.g. of ITO and AZO) of two sputtering targets may be influenced by means of the following parameters:

Degree of interpenetration of material flows;
Distance between the two target materials (e.g. sputtering targets);
Alignment of the magnetic fields that interpenetrate the two target materials (e.g. sputtering targets);
spatial distribution of the plasma by means of which the two target materials (e.g. sputtering targets) are atomized;
a physical gas separation between the two target materials (e.g. a partition or a gas separation chamber).

For example, the formation of the mixed layer may be inhibited,
when the process chambers are extended in the transport direction, thus increasing the distance between the two sputtering targets;
when the magnetic fields of the two sputtering targets are aligned outward toward the chamber wall;
when a partition is installed up to the substrate between the two sputtering targets;
by installing additional process or gas separation chambers in the sputtering system in order to sufficiently and spatially divide the layer separation.

However, this may increase the cost of a sputtering system with extended sputtering chambers. It also increases the system's length, which is often not desired. Separation may reduce the steam utilization of the sputtered material and thus also the rate, because sputtering is applied to the chamber walls and the partition wall. This may increase the coating costs.

According to various embodiments, already-delivered sputtering systems or even just-sold sputtering systems may be cost-effectively converted to deposit ITO and AZO layers, for example, without having to expand them. Significant target costs are saved by using less expensive AZO targets. A layer stack with one or more than one mixed layer of two different TCOs, e.g. ITO and AZO, may be sputtered in the same vacuum chamber (also called the vacuum processing chamber or processing chamber). The facilitates the further improvement of the solar cell properties. The sputtering system may be manufactured at a lower cost because fewer process chambers or narrower process chambers may be used. The mixed layer may further promote adhesion and steam-heat stability of the TCO layer stack.

FIGS. 6A and 6B respectively illustrate a vacuum arrangement 600a and 600b, according to various embodiments, for example according to any of examples 1 to 25, in a schematic side view or cross-sectional view. The vacuum arrangement 600a and 600b includes the vacuum chamber 802 and a transport device (not shown) for transporting the solar cell precursor 202 in the vacuum chamber 802 along the transport direction 111r.

In the following table, properties of two comparative examples are reproduced, of which the first TCO layer stack AZO/ITO (220303#11) was deposited in two separate processing chambers 802 (case 2, see vacuum arrangement 600b) and the second layer stack (220223#5) was deposited in exactly one processing chamber 802 (case 1, see vacuum arrangement 600a), e.g. by means of two tube magnetrons arranged close to each other. One of the tubular magnetrons includes a ceramic AZO target and the other tubular magnetron includes a ceramic ITO tubular target.

| Test | 220223#5 | 220303#11 |
|---|---|---|
| AZO Oxygen [%] | 2.0 | 1.5 |
| ITO Oxygen [%] | | 2.6 |
| Layer Thickness [nm] | 110 | 106 |
| Surface Resistance [Ohm] | 326 | 348 |
| Specific Resistance [µOhm cm] | 3580 | 3696 |
| Realized Transmission between 400 and 110 nm [%] | 82.6 | 82.6 |

The process parameters for forming the TCO layer stack 220303#11 were adjusted in such a way that its coating properties differ as little as possible from the coating properties of the TCO layer stack 220223#5. As may be seen, the process parameters for forming the TCO layer stack 220303#11 include different oxygen contents in the process gas of both processing chambers, which may complicate the production.

In contrast, forming the TCO layer stack 220223#5 may be subjected to the same gas pressure and/or chemical composition of the process gas without having to accept a degradation of the coating properties. This may facilitate the manufacturing process. More generally, it may be inferred from these data that the mixing of indium, zinc and oxygen (e.g. of ITO and AZO) improves the coating properties and thus compensates for less favorable manufacturing conditions.

Figure 7A:
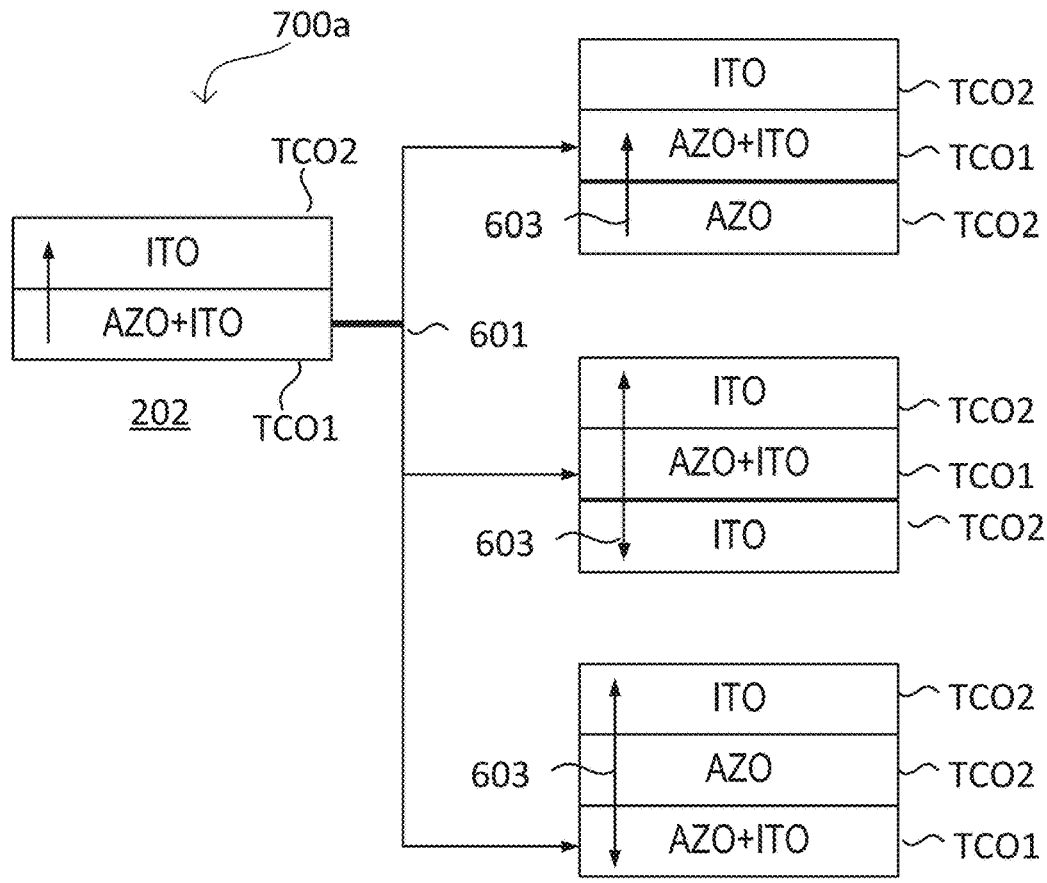
FIGS. 7A and 7B each illustrate a coating of the solar cell precursor in various configurations according to various embodiments.
Figure 7B:
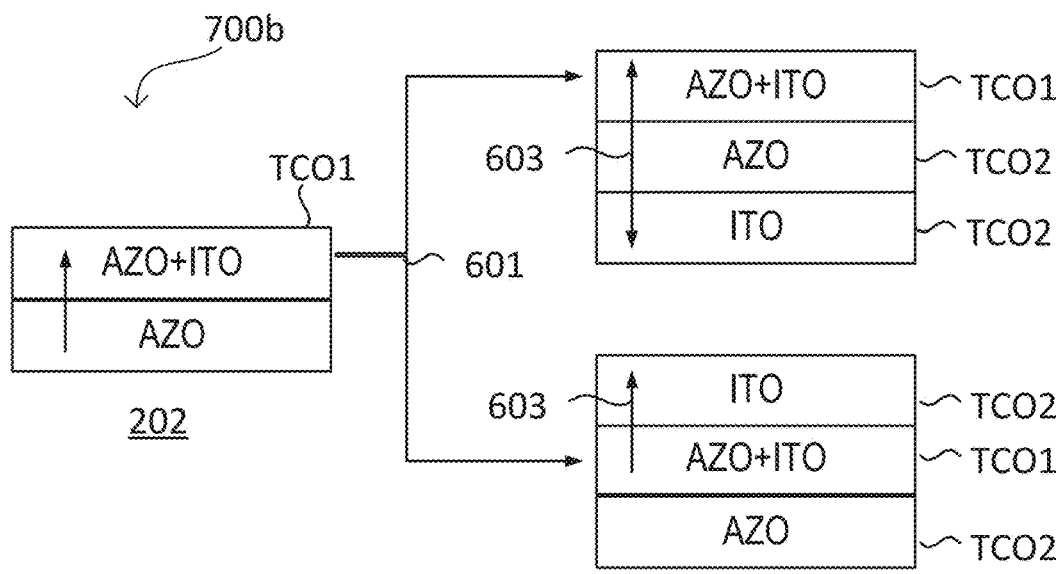

FIGS. 7A and 7B respectively illustrate the coating of the solar cell precursor in different configurations. Shown on the left is the base configuration 700a and 700b of the coating, including the first TCO layer TCO1 and a second TCO layer TCO2, and on the right is a modification 601 of the base configuration 700a and 700b by adding an additional second TCO layer TCO2 to the coating. For example, two second TCO layers TCO2 may either contact each other or each contact the first TCO layer TCO1. Two second TCO layers TCO2 may differ from each other in their chemical composition, for example in the proportion of zinc or indium. Each second TCO layer TCO2 may, for example, consist of either AZO or ITO.

In each case, the arrow 603 indicates the direction (e.g., direction of the layer thickness) in which the concentration of indium increases.

An exemplary implementation of modification 601 of base configuration 700b comprises two second TCO layers TCO2 between which the first TCO layer TCO1 is disposed, for example, in physical contact with one or more than one of the two second TCO layers TCO2. For example, the first TCO layer TCO1 may comprise or consist of at least indium and oxygen (e.g., a chemical compound thereof) and optionally zinc, tin, and/or aluminum, for example, a mixture of ITO and AZO. Alternatively or additionally, one or more than one of the two second TCO layers TCO2 may comprise or consist of indium and oxygen (e.g., a chemical compound thereof, for example ITO) and optionally zinc and/or have a smaller layer thickness than the first TCO layer TCO1.

For example, one of the two second TCO layers TCO2 (e.g., consisting of ITO) may be in physical contact with the substrate (e.g., its semiconductor material) and/or with the first TCO layer TCO1 (e.g., consisting of the mixture of ITO and AZO). This may improve the adhesion of the first TCO layer TCO1 to the substrate (e.g., its semiconductor material). Alternatively or additionally, the first TCO layer TCO1 (e.g., consisting of the mixture of ITO and AZO) may be arranged between and/or in physical contact with the two second TCO layers TCO2 (e.g., consisting of ITO). This may improve the adhesion to the substrate and the lifetime of the first TCO layer TCO1.

Alternatively or additionally, the first TCO layer TCO1 near the solar cell precursor 202 may comprise a smaller proportion of the second target material M2 than near the second TCO layer TCO2 or be free of the second target material M2, which may comprise or consist of, for example, indium oxide (IO), such as ITO.

An exemplary implementation of a method 100, which forms a modification 601 of the base configurations 700a, 700b, is carried out by means of four targets arranged in series along the transport direction of the substrate (e.g., provided by means of two double-tube magnetrons), of which at least two (e.g., directly opposite each other) targets differ from each other (e.g., in chemical composition and/or sputtering rate) and/or of which two or three targets match (e.g., in chemical composition and/or sputtering rate).

For example, of the four targets, a first target and/or a second target may comprise the second target material M2. Alternatively or additionally, of the four targets, one or more than one target disposed between the first target and the second target may comprise the first target material M1.

The greater the rate at which a target is atomized (also referred to as the atomization rate), the greater the rate at which forming a layer can occur (also referred to as the coating rate). In terms of forming a layer, the resulting layer thickness of the layer is a function of the atomization rate and the time it takes to form the layer (also referred to as the coating time). If the substrate is transported at a constant transport speed, the coating duration is a function of the number of targets that are atomized at the atomization rate and are usually arranged one behind the other along the transport direction. Based on this, the amount of material of a material (e.g., a chemical compound, which may optionally be doped, e.g., AZO) in a layer stack comprising one or more than one first TCO layer TCO1 and one or more than one second layer TCO2 can also be specified as the thickness of a layer (also referred to as layer thickness equivalent) that would be formed if it consisted of the amount of the material. The layer thickness equivalent allows to better compare the composition of layer stacks, even if the materials are partially mixed.

This is illustrated by an exemplary layer stack comprising the first TCO layer TCO1 (comprising the mixture of ITO and AZO) between the two second TCO layers TCO2 (comprising ITO) (also referred to as ITO/ITO+AZO/ITO stack). For example, the ITO/ITO+AZO/ITO stack may comprise a layer thickness equivalent $d_{AZO}$ of AZO sandwiched between two separated layer thickness equivalents $d_{ITO}$ of ITO. For example, the layer thickness equivalent $d_{AZO}$ may be in a range from about 30 nm to about 100 nm, e.g., 70 nm, and/or may be greater than the layer thickness equivalent $d_{ITO}$. Alternatively or additionally, the film thickness equivalent $d_{ITO}$ may be, for example, in a range from about 5 nm to about 30 nm, e.g., 15 nm.

If the amount of AZO in the layer stack comprising, for example, the first TCO layer TCO1 (e.g., comprising the mixture of ITO and AZO) between the two second TCO layers TCO2 (e.g., comprising ITO) is to be increased, this can be achieved by increasing the number of targets of AZO and/or the electrical power that converts the plasma by means of which AZO is atomized.

For example, the ITO/ITO+AZO/ITO stack can be formed by means of two double-tube magnetrons, between which a chamber wall (e.g., a compartment partition) is optionally arranged, and each of which double-tube magnetrons comprises two targets. The two double-tube magnetrons may comprise a number $k_{AZO}$ of targets made of AZO and a number $k_{ITO}$ of targets made of ITO, where $k_{AZO}=1$ or $k_{AZO}=2$ and $k_{ITO}=4-k_{AZO}$. Each of the targets of AZO may be disposed between two of the targets of ITO and configured to form, together with at least one of the targets of ITO, the mixture of ITO and AZO, e.g., by interpenetrating the streams of material emitted from those targets. For example, only one or each of the two double-tube magnetrons may comprise a target of ITO and a target of AZO whose emitted material flows interpenetrate each other, for example arranged according to the following order: ITO/AZO-AZO/ITO or ITO/ITO-AZO/ITO or ITO/AZO-ITO/ITO. The two dual tube magnetrons may optionally be exposed to the same chemical composition of the process gas (e.g., comprising or forming molecular oxygen) and/or the same process gas pressure. For example, two tubular targets may be used per compartment of a vacuum chamber, disposed within the compartment and/or exposed to molecular oxygen as the process gas.

It may be understood that what is described herein by way of example for AZO may apply by analogy to the first target material M1 in general and/or what is described herein by way of example for ITO may apply by analogy to the second target material M2 in general.

The greater the proportion of indium (or a chemical compound, e.g. oxide, thereof, e.g. InO) of the layer stack at the interface to the substrate (e.g. its semiconductor material), the better the adhesion of the layer stack to the substrate. If the layer stack comprises a mixture of ITO and ATO in contact with the substrate (e.g., its semiconductor material), then the greater the ratio of indium to tin in the mixture, the better the adhesion between them. For example, adhesion may be substantially improved when more indium (or a chemical compound, e.g. oxide, thereof, e.g. InO) than zinc (or a chemical compound, e.g. oxide, thereof, e.g. ZnO) is in contact with the substrate (e.g. its semiconductor material).

While the disclosure has been particularly shown and described with reference to specific aspects, it should be understood by those skilled in the art that various changes in form and detail may be made therein without departing from the spirit and scope of the disclosure as defined by the appended claims. The scope of the disclosure is thus indicated by the appended claims and all changes, which come within the meaning and range of equivalency of the claims, are therefore intended to be embraced.

The invention claimed is:

1. A method of processing a solar cell precursor, the method comprising:
   forming a first layer of a stack of at least two solid phase layers over the solar cell precursor, wherein the first layer is transparent and electrically conductive and comprises at least indium, zinc, and oxygen; and
   forming a second layer of the stack over the solar cell precursor wherein the second layer is transparent and electrically conductive and comprises oxygen and a proportion of indium that is greater than that of the first layer, wherein the second layer is arranged on the solar cell precursor and arranged in the stack between the solar cell precursor and the first layer.

2. The method according to claim 1, the method further comprising transporting the solar cell precursor while forming the first layer and while forming the second layer.

3. The method according to claim 1, wherein the second layer is in physical contact with the first layer.

4. The method according to claim 1, wherein a first material flow for forming the first layer and a second material flow for forming the second layer interpenetrate or are exposed to the same process gas.

5. The method according to claim 1, wherein the second layer is in physical contact with a semiconductor of the solar cell precursor or an oxide of the semiconductor.

6. The method according to claim 1, wherein a stack comprising the first layer and the second layer has a reflection coefficient of less than 10%.

7. The method according to claim 6, wherein the reflection coefficient is at a wavelength of 600 nm.

8. The method according to claim 1, wherein the first layer comprises a layer thickness that is greater than that of the second layer.

9. The method according to claim 1, wherein the second layer comprises a dopant of a chemical compound of indium with oxygen.

10. The method according to claim 9, wherein the dopant comprises at least one of tin, zirconium, titanium, cerium, and tungsten.

11. The method according to claim 1, wherein the second layer comprises more indium than zinc.

12. The method according to claim 1, wherein the forming of the first layer is performed by sputtering a first sputtering target, and wherein the forming of the second layer is performed by sputtering a second sputtering target.

13. The method according to claim 12, wherein the first sputtering target or the second sputtering target comprise ceramic.

14. The method according to claim 1, the method further comprising covering the solar cell precursor with an additional second layer between the first layer and the second layer, wherein the additional second layer is transparent and electrically conductive, wherein the first layer comprises a layer thickness that is greater than that of the additional second layer.

15. A method of processing a solar cell precursor, the method comprising:
    emitting a first material flow comprising zinc and oxygen toward the solar cell precursor; and
    emitting a second material flow comprising indium and oxygen toward the solar cell precursor,
    wherein the emitting of the first material flow and the emitting of the second material flow comprise forming a mixture of materials that coats the solar cell precursor with a layer of the mixture of materials, wherein the mixture of materials is transparent, electrically conductive, and comprises a proportion of indium that decreases through the layer along a direction away from the solar cell precursor.

16. The method of claim 15, wherein the mixture of materials comprises more indium than zinc.

17. The method of claim 15, wherein the proportion of indium decreases continuously through the layer along the direction away from the solar cell precursor.

* * * * *